US011528016B2

(12) United States Patent
Heshami et al.

(10) Patent No.: US 11,528,016 B2
(45) Date of Patent: Dec. 13, 2022

(54) LOW LATENCY COMPARATOR WITH LOCAL CLOCK CIRCUIT

(71) Applicant: Apple Inc., Cupertino, CA (US)

(72) Inventors: Mehrdad Heshami, Sunnyvale, CA (US); Jafar Savoj, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/154,699

(22) Filed: Jan. 21, 2021

(65) Prior Publication Data

US 2022/0231672 A1   Jul. 21, 2022

(51) Int. Cl.
*H03K 5/00* (2006.01)
*H03K 3/0233* (2006.01)
*H03K 5/1536* (2006.01)
*H03K 5/1532* (2006.01)

(52) U.S. Cl.
CPC ......... *H03K 3/0233* (2013.01); *H03K 5/1532* (2013.01); *H03K 5/1536* (2013.01)

(58) Field of Classification Search
None
See application file for complete search history.

(56) References Cited

U.S. PATENT DOCUMENTS

| 3,758,720 A * | 9/1973 | Dinn | H04L 7/033 375/376 |
| 5,548,251 A * | 8/1996 | Chou | H03K 3/0231 331/177 R |
| 5,982,156 A * | 11/1999 | Weimer | H02M 3/156 323/222 |
| 6,079,027 A * | 6/2000 | Lai | G06F 1/08 713/400 |
| 6,366,113 B1 * | 4/2002 | Song | H03K 3/356139 326/24 |
| 6,389,492 B1 * | 5/2002 | Larson | G06F 13/364 710/107 |
| 6,573,775 B2 * | 6/2003 | Pilling | H03K 3/356139 327/202 |
| 6,597,303 B2 | 7/2003 | Cosand | |
| 6,608,503 B2 | 8/2003 | Shenai et al. | |
| 7,233,172 B2 * | 6/2007 | Kanamori | G11C 7/065 327/55 |

(Continued)

FOREIGN PATENT DOCUMENTS

| CN | 202334463 U | 7/2012 |
| EP | 0435148 A1 | 7/1991 |

*Primary Examiner* — Tuan T Lam
(74) *Attorney, Agent, or Firm* — Kowert, Hood, Munyon, Rankin & Goetzel, P.C.; Erik A. Heter; Dean M. Munyon

(57) ABSTRACT

A low latency comparator circuit with a local clock circuit is disclosed. A comparator circuit configured to compare a first input signal to a second input signal. The comparator circuit includes at least one regenerative latch circuit having a first and second inputs configured to receive the first and second input signals, respectively. The comparator circuit further includes a clock circuit configured to generate and provide a clock signal exclusively to circuitry in the comparator circuit, including the at least one regenerative latch circuit. At least one output latch circuit coupled to the at least one regenerative latch circuit and configured to provide a first output signal indicative of a comparison of the first and second input signals.

20 Claims, 8 Drawing Sheets

(56) References Cited

U.S. PATENT DOCUMENTS

| | | | | |
|---|---|---|---|---|
| 7,352,224 B2* | 4/2008 | Schabel | .................. | H03K 5/04 |
| | | | | 327/291 |
| 7,778,374 B2* | 8/2010 | Jeon | .................. | H04L 25/0292 |
| | | | | 375/372 |
| 8,000,672 B2* | 8/2011 | Sumesaglam | ........ | G11C 7/1087 |
| | | | | 455/252.1 |
| 10,686,431 B1 | 6/2020 | Lin | | |
| 10,756,710 B2* | 8/2020 | Bell | ........................ | H03K 3/86 |
| 2003/0201800 A1* | 10/2003 | Matsuo | .................. | H03M 9/00 |
| | | | | 327/57 |
| 2010/0156544 A1* | 6/2010 | Lee | .................... | H03K 3/0322 |
| | | | | 331/57 |
| 2019/0214906 A1* | 7/2019 | Mahmoudi | ............. | H02M 3/18 |

* cited by examiner

LOW LATENCY COMPARATOR WITH LOCAL CLOCK CIRCUIT

BACKGROUND

Technical Field

This disclosure is related to electronic circuits, and more particularly, to comparator circuits.

Description of the Related Art

Comparators are widely used in electronic circuits. A comparator is a circuit that compares the magnitude of two input signals and generates an output signal based on the comparison. When implemented as an analog circuit, a comparator may comprise an amplifier circuit having two inputs and providing a single output signal. The output signal may be driven to one of two levels dependent on which of the two input signals has the greater magnitude.

SUMMARY

A low latency comparator circuit with a local clock circuit is disclosed. In one embodiment, a comparator circuit configured to compare a first input signal to a second input signal. The comparator circuit includes at least one regenerative latch circuit having a first and second inputs configured to receive the first and second input signals, respectively. The comparator circuit further includes a clock circuit configured to generate and provide a clock signal exclusively to circuitry in the comparator circuit, including the at least one regenerative latch circuit. At least one output latch circuit coupled to the at least one regenerative latch circuit and configured to provide a first output signal indicative of a comparison of the first and second input signals.

In one embodiment, the regenerative latch circuit may generate first and second data signals on internal data nodes, responsive to an edge of the clock signal. The output latch circuit may receive the data signals, and generate an output signal based thereon. The data signals, and thus the output signal, may correspond to levels of the first and second input signals relative to one another.

In one embodiment, a comparator circuit may include a plurality of regenerative latch circuits and a corresponding plurality of output latch circuits. The first and second input signals may be provided to each of the plurality of regenerative latch circuits. The clock signal may also be provided to the plurality of regenerative latch circuits, in different phases in some embodiments. At least one of the plurality of regenerative latch circuits may, responsive to an edge of the clock signal, generate data signals corresponding to the relative levels of the first and second input signals, and generate a corresponding output signal as well. The output signals of each of the plurality of regenerative latch circuits may be ORed together, with the output of a corresponding OR gate providing the result of the comparison.

BRIEF DESCRIPTION OF THE DRAWINGS

The following detailed description makes reference to the accompanying drawings, which are now briefly described.

DETAILED DESCRIPTION OF EMBODIMENTS

Figure 1:
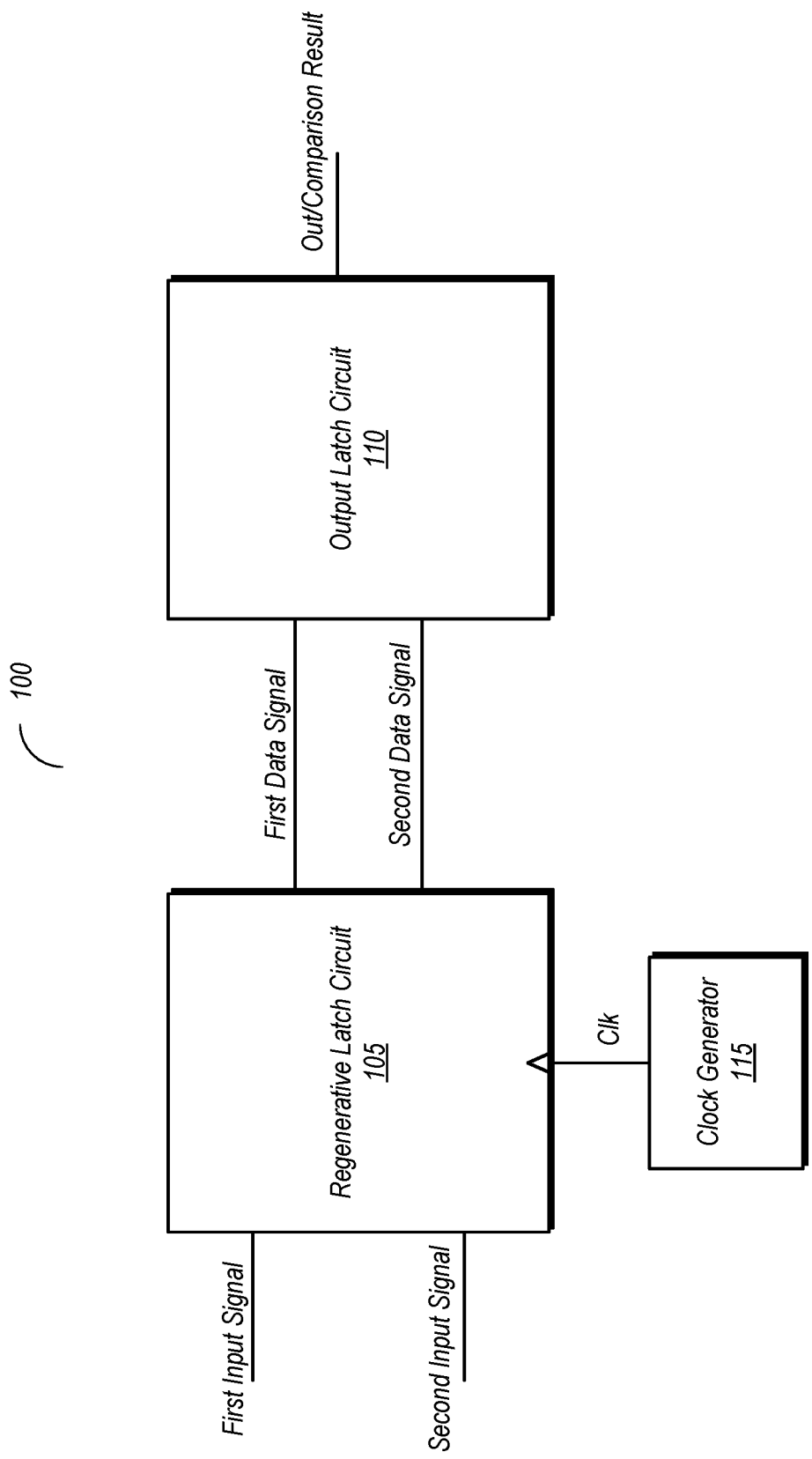
FIG. 1 is a block diagram of one embodiment of a comparator circuit.

The present disclosure is directed to a comparator circuit having a local (and dedicated) clock circuit arranged to provide a clock signal exclusively to circuitry within the comparator. Current state of the art comparators are typically based on linear amplifiers. These are basically operational amplifier circuits that are arranged to receive two single-bit signals and drive the output value to a zero or a one (high or low) depending on which of the two have a greater value. Amplifier-based comparator circuits are generally speed-limited. Accordingly, such comparator circuits may be unable to produce a result at a speed sufficient for many high-speed applications. Furthermore, amplifier-based comparators are often times inefficient with regard to power usage.

A regenerative amplifier (also referred to as a regenerative latch) is capable of switching output states significantly faster than a linear amplifier used to implement a comparator circuit. This is in part due to the internal positive feedback. For a given power consumption, positive feedback produces more gain than a circuit such as a linear amplifier that does not have positive feedback. This in turn leads to faster amplification of the difference between the input signals, and thus faster switching of the output. However, a regenerative latch operates based on a clock signal.

Accordingly, various embodiments of a comparator circuit of the present disclosure utilize a regenerative latch/amplifier and a local clock circuit. The local clock circuit is coupled to provide its correspondingly generated clock signal exclusively to circuitry within the comparator circuit, and may be implemented in close proximity thereto. An output latch circuit, such as a set-reset (SR) latch is configured to stabilize the output provided from the regenerative latch. The resulting comparator may thus provide very low latency in generating a comparison result, and may thus be useful for high speed applications. This makes the comparator useful for applications such as detecting voltage droops to enable corrective/mitigating actions to be taken in with a minimum of delay. The comparator circuit of the present disclosure may also consume less power than a linear amplifier-based comparator circuit.

Embodiments of the comparator circuit may also be implemented in multi-path embodiments, further reducing the latency. In multi-path embodiments, multiple instances of a regenerative latch circuit and corresponding output latch are provided. Each of the regenerative latches receives the same set of input signals, and receives a particular phase of the clock signal. The dividing of the clock signal into different phases further reduces the latency of detecting a change of the input signals. The output of the output latch circuits may be ORed together. When the relative levels of the input signals change, the change is detected by the first regenerative latch circuit receiving a clock edge during a transition to an active clock phase. The output from the path in which the change is detected is provided through an OR gate, with the other paths eventually producing the same result.

The remaining description begins with a discussion of various embodiments of the disclosure, including single and multi-path embodiments, including a detailed schematic of one embodiment. A use case example, in which a comparator is implemented in a voltage droop detection circuit, is then discussed. Thereafter, the discussion is directed to a method of operating a comparator, and concludes with a description of an example system.

Embodiments of a Comparator Circuit Utilizing Regenerative Latch Circuitry:

FIG. 1 is a block diagram of one embodiment of a comparator circuit. In the embodiment shown, comparator circuit includes a regenerative latch circuit 105, an output latch circuit 110, and a clock generator 115.

Regenerative latch circuit 105 in the embodiment shown is configured to receive a first input signal and a second input signal. These input signals may have respective voltage values, often times with one being greater than the other. Regenerative latch circuit 105 may generate corresponding first and second data signals based on the relative voltages of the first and second input signals. The first and second data signals generated by regenerative latch circuit 105 may be logically complementary to one another, one being a logic zero while the other being a logic one.

Generation of the first and second data signals by regenerative latch circuit 105 may occur in in accordance with a clock signal, Clk, generated by clock generator 115. In the embodiment shown, clock generator 115 may be any suitable type of clock generation circuitry, such as a ring oscillator. Furthermore, clock generator 115 in various embodiments is arranged to provide the clock signal exclusively to circuitry in comparator 100. Accordingly, the clock signals is a dedicated clock signal that is used to synchronize the operation of comparator 100 in the embodiment shown, but is not received by or synchronize the operation of any other circuitry that is not part of comparator 100.

The comparing of the levels of the first and second input signals is performed by regenerative latch circuit 105 when the clock signal is in an active phase (e.g., high). Thus, responsive to a clock edge in which the clock signal transitions from an inactive phase (e.g., low) to the active phase, regenerative latch circuit 105 may perform a comparison of the first and second input signals and generate the first and second data signals based thereon. When the clock signal is in the inactive phase, a precharge is conducted on internal data nodes upon which the first and second data signals are generated. A discussion of a schematic directed to one embodiment of a regenerative latch circuit is provided below.

The first and second data signals generated by regenerative latch circuit 105 are received by output latch circuit 110. Output latch circuit 110 may be implemented using one of a number of different types of latch circuits. In one embodiment, output latch circuit 110 may be implemented using a set-reset (SR) latch circuit, although the disclosure is not limited to such embodiments. Latch circuits such as Z-keepers are also possible and contemplated. The output latch circuit 110 may provide stabilization of the comparison results. Output latch circuit 110 in the embodiment shown produces an output signal that is equivalent to the comparison results as determine by regenerative latch circuit 105.

It is noted that the devices used to implement the various circuits of comparator 100 may be configured such that their respective operating characteristics track one another over process, voltage, and temperature variations. Accordingly, variations from these factors may affect all of the circuitry in comparator 100 substantially equally.

Figure 2:
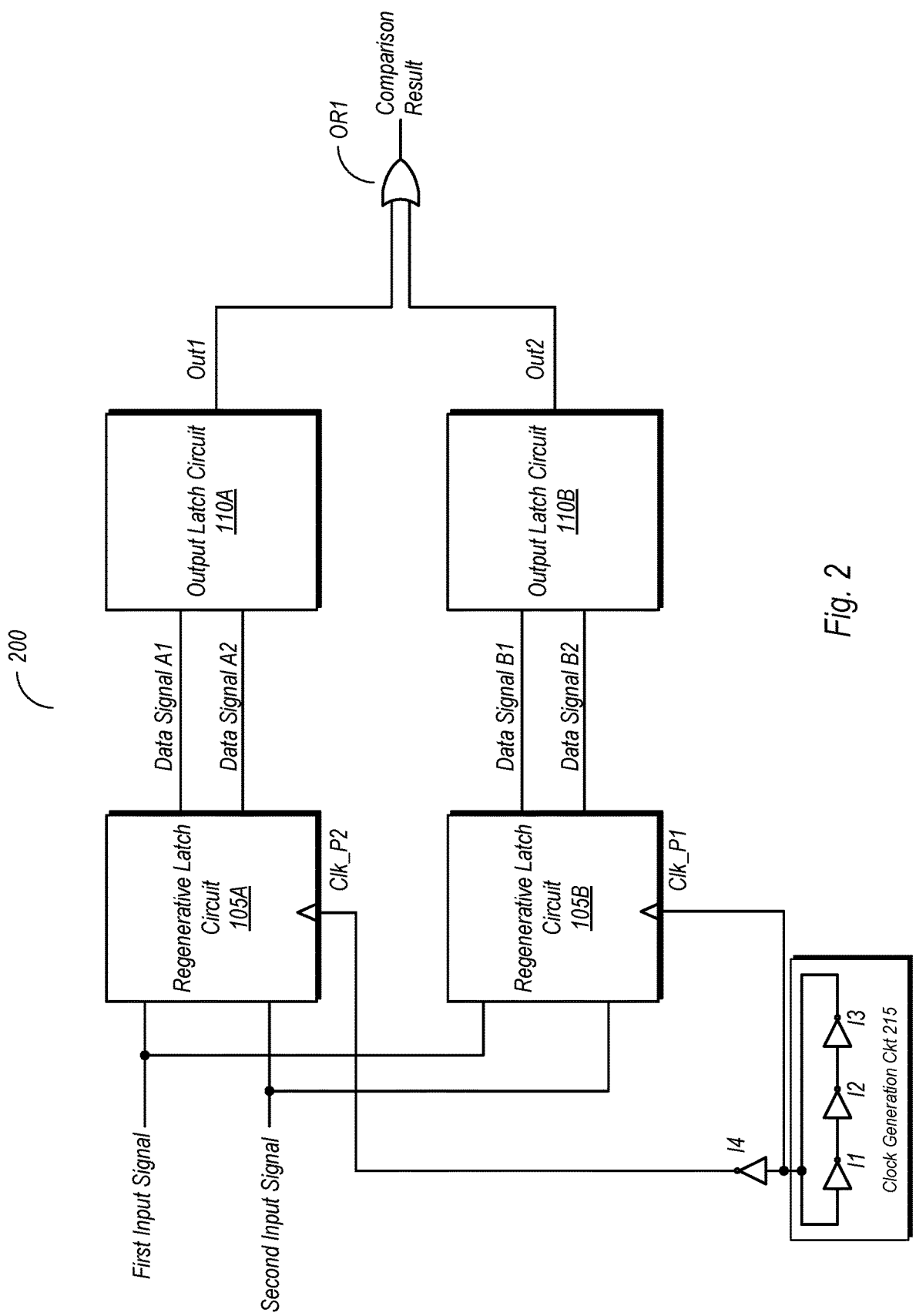
FIG. 2 is a block diagram of another embodiment of a comparator circuit.

FIG. 2 is a block diagram of another embodiment of a comparator circuit. In this particular embodiment, comparator 200 is a multi-path comparator, including two regenerative latch circuits 105 and two output latch circuit 110. In particular, regenerative latch circuit 105A is coupled to output latch 110A, while regenerative latch circuit 110B is coupled to output latch 110B. Both regenerative latch circuits 110A and 110B are coupled to receive the first and second input signals and perform comparison operations thereon. Regenerative latch circuit 105A is configured to generate data signals A1 and A2, while regenerative latch circuit 105B is configured to generate data signals B1 and B2. Output latch circuit 110A is configured to generate a first output signal, Out1, based on data signals A1 and A2. Output latch circuit 110B is configured to generate a second output signal, Out2, based on data signals B1 and B2. The output signals are received by an OR gate, OR1, which outputs the comparison result.

Clock generation circuit 215 in the embodiment shown implements a ring oscillator comprising inverters I1, I2, and I3. An additional inverter, I4, is coupled to receive the clock signal generated by clock generation circuit 215. As shown here, regenerative latch circuit 105B is coupled to receive the original phase of the clock signal generated by clock generation circuit 215, designated here as Clk_P1. The output of I4, Clk_P2, is received by regenerative latch circuit 105A. When the relative voltage levels of the input signals change, the first one of regenerative latch circuit 105A and 105B to receive a clock edge corresponding from an inactive-to-active transition of the clock signal (e.g., a rising edge) may generate data signals that result in a state change (e.g., logic 0 to logic 1) of the output signal of the corresponding output latch circuit. This output signal is then propagated through OR1 to generate the comparison result. Eventually, both of the output latch circuits 110A and 110B produce respective output signals at the same logic value in the illustrated embodiment, although one precedes the other.

The use of two paths in the illustrated embodiment may thus provide a faster generation of a comparison result (and thus lower latency). In this particular embodiment, the latency may be reduced by a half clock cycle given the different phases of the clock signal received by regenerative latch circuits 105A and 105B.

Figure 3:
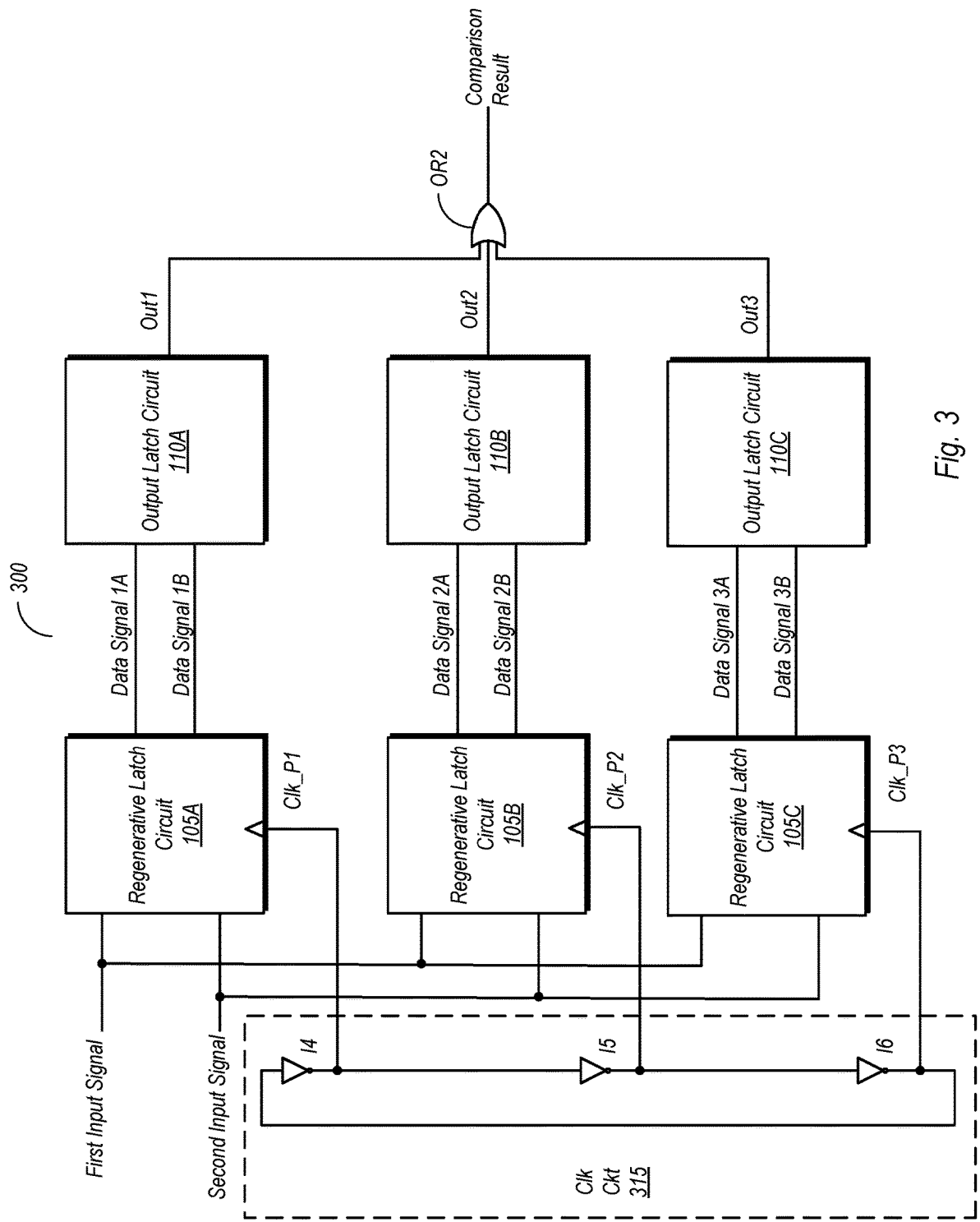
FIG. 3 is a block diagram of another embodiment of a comparator circuit.

FIG. 3 illustrates a three path embodiment of a comparator circuit. In this embodiment, comparator 300 includes regenerative latch circuits 105A, 105B, and 105C, which are respectively coupled to output latches 110A, 110B, and 110C. Each of the regenerative latch circuits 105A, 105B and 105C generates corresponding data signals (1A and 1B for 105A, 2A and 2B for 105B, and 3A and 3B for 105C). Based on the correspondingly received data signals, output latch circuits 110A, 110B, and 110C generate output signals Out1, Out2, and Out2, respectively. These signals are ORed together by OR gate OR2, which outputs the final comparison result.

Clock circuit 315 in the embodiment shown includes inverters I4, I5, and I6. Each inverter output is coupled to a clock input of a correspondingly coupled one of the regenerative latch circuits (Clk_P1 to 105A, Clk_P2 to 105B, and Clk_P3 to 105C). Thus, each of the regenerative latch circuits 105A, 105B, and 105C is coupled to receive a different phase of the clock signal generated by clock circuit 315. Comparator 300 works on principle similar to that discussed above with reference to comparator 200 of FIG. 2, wherein the first regenerative latch circuit to receive an inactive-to-active edge of the clock signal after the input signals change will be the first to cause generation of a change to the comparison result output signal. As with the previously discussed embodiment, eventually all of the output latch circuits providing respective output signals at the same level to OR gate OR2. This embodiment may provide an additional latency reduction over the embodiment discussed above with reference to FIG. 2.

Figure 4:
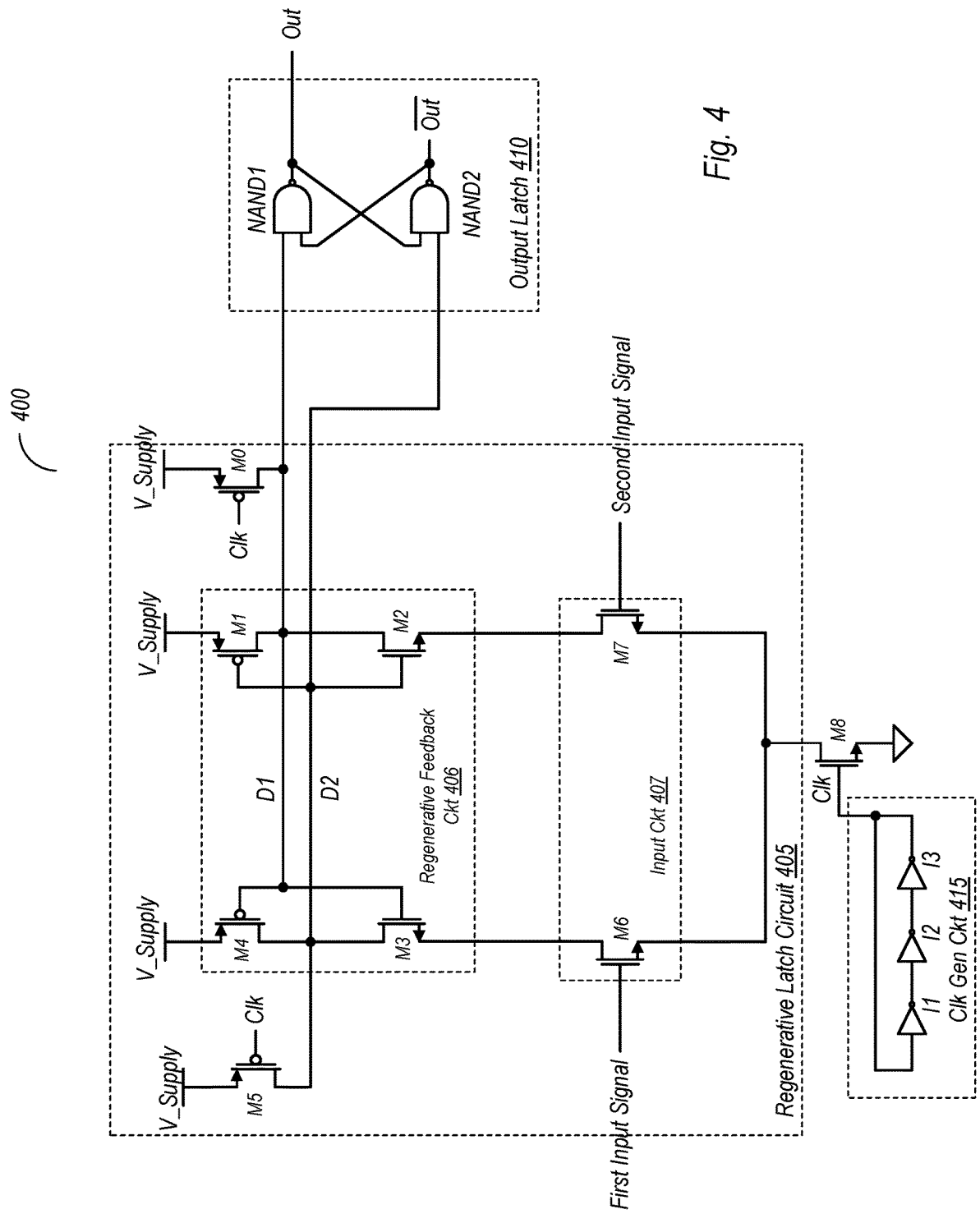
FIG. 4 is a schematic diagram of one embodiment of a comparator circuit.

FIG. 4 is a schematic diagram of one embodiment of a comparator circuit. In the embodiment shown, a single-path implementation of comparator 400 includes a regenerative latch circuit 405, an output latch circuit 410, and a clock generation circuit 415, which is similar to clock generation circuit 215 of FIG. 2. Each of the circuits shown here may be implemented in their counterparts shown in FIGS. 1-3, although other embodiments are possible and contemplated.

In the embodiment shown, the gate terminal of transistor M8 is coupled to receive the clock signal, Clk, from clock circuit 415, which includes inverters I1, I2, and I3. In this embodiment, the clock signal is considered active when high and inactive when low. When high (and thus active in this embodiment), the clock signal causes activation of transistor M8 to complete a pulldown path through one of the branches of regenerative latch circuit 405. The clock signal is also provided to transistor M0 and M5 in the embodiment shown (e.g., to respective gate terminals of M0 and M5). During the inactive, low phase of the clock signal in the embodiment shown, transistors M0 and M5 are activated, providing a pull-up path between internal data nodes D2 and D1, respectively, and a supply voltage, V_supply. This results in precharging of internal data nodes D1 and D2.

Input circuit 407 of regenerative latch circuit includes transistors M6 and M7. Transistor M6 is coupled to receive the first input signal on its gate terminal, while transistor M7 is coupled to receive the second input signal on its gate terminal. When M6 is active concurrent with transistor M3, a pulldown path may exist between internal data node D2 and ground. Similarly, when M7 is active concurrent with M2, a pulldown path may exist between internal data node D1 and ground. The relative strengths of the two pulldown paths at any given time may depend on the respective voltages of the first and second input signals. For example, if the voltage of the first input signal is greater than that of the second input signal, the pulldown path through M6 may be greater than that through M7, and vice versa.

Due to the positive feedback of regenerative feedback circuit 406, one of the internal data nodes will eventually become a logic high while the other will be pulled to a logic low. For example, if the pulldown strength through M6 is greater than that through M7, D2 will be pulled low, and eventually cause the activation of M1 and the deactivation of M2. Accordingly, D1 is pulled high.

If the voltage of the second input signal is greater than that of the first input signal, the pulldown path from D1 to ground through M7 and M2 eventually causes activation of M4 and deactivation of M3. This blocks the pulldown path from D2 to ground and cause activation of m4, pulling D2 high.

Output latch 410 in the embodiment shown is implemented as a set-reset (SR) latch, although other types of latches are possible and contemplated. In the embodiment shown, output latch 410 includes two NAND gates, NAND1 and NAND2. NAND1 is coupled to receive inputs D1 and $\overline{Out}$, while NAND2 is coupled to receive inputs D2 and Out.

During the active phase of the clock signal, when D1 and D2 are at different logic values, respective values of Out and $\overline{Out}$ settle in accordance with the captured values of D1 and D2. When the clock signal is inactive and D1 and D2 are both high due to the precharge, NAND1 and NAND2 hold the most recent values of Out and $\overline{Out}$.

Generally speaking, output latch 410 may be implemented in any configuration in which its output signal may change with changes to the states of values on the internal data nodes during an active portion of the clock signal and maintain corresponding output signal values during the next inactive portion of the clock signal.

Figure 5:
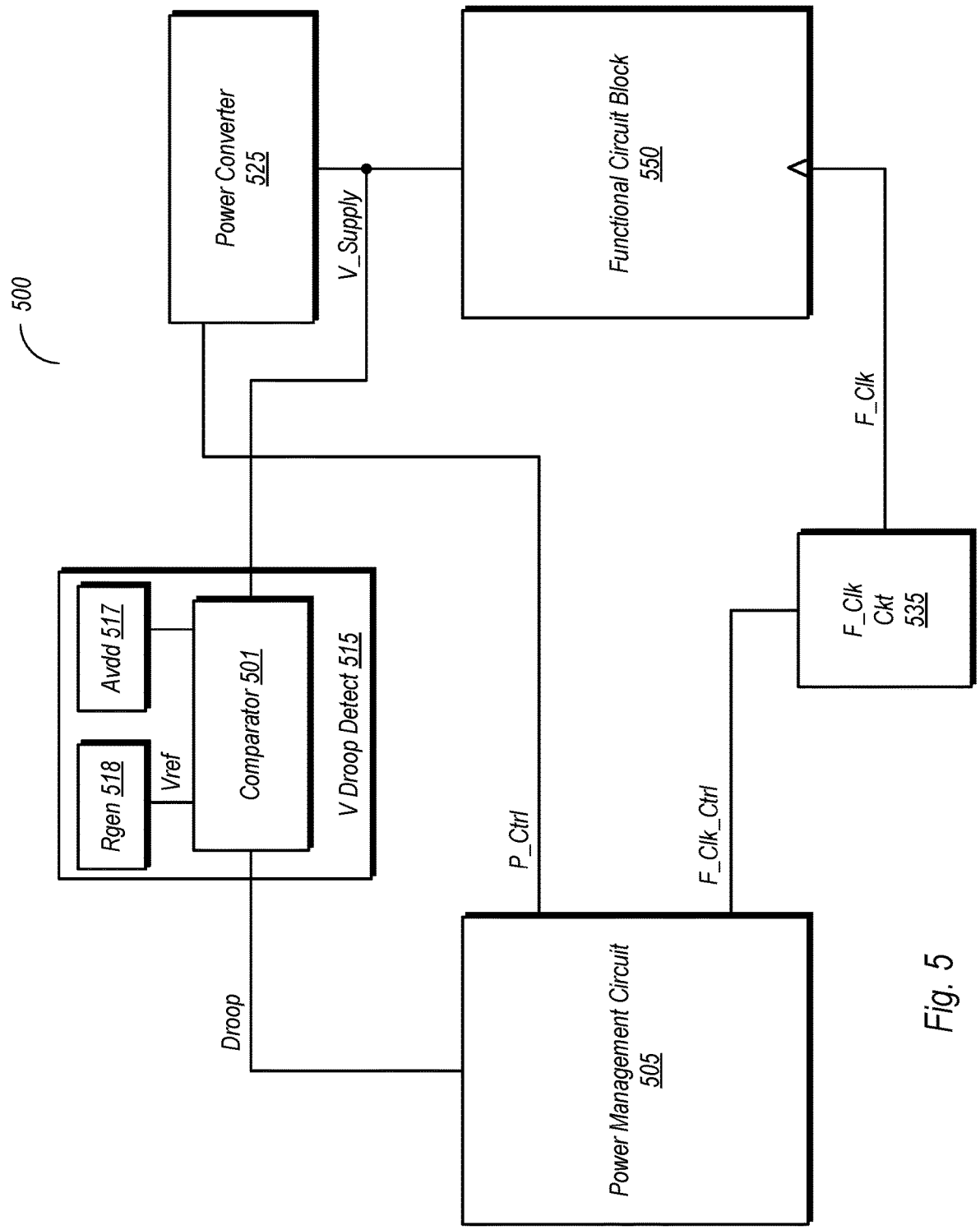
FIG. 5 is a block diagram of one embodiment of a system having a voltage droop detector circuit including an embodiment of a comparator as disclosed herein.

System with Voltage Droop Detector and Power Management Circuit:

FIG. 5 is a block diagram of one embodiment of a system having a voltage droop detection circuit. In the embodiment shown, system 500 includes a power management circuit 505, a voltage droop detection circuit 515, a power converter 525, a clock control circuit 525, and a functional circuit block 550. It is noted that the system shown here is exemplary, and other components may be present.

In the embodiment shown, power management circuit 505 may perform various power management functions. These power management functions may include controlling various performance states (e.g., based on a supply voltage value and/or a frequency of a received clock signal), workload allocation and re-allocation, thermal management, and performing corrective actions in response to various events. In this particular embodiment shown, power management circuit 505 may generate one or more power control signals (P_Ctrl) and one or more clock frequency control signals (F_Clk_Ctrl). The power control signals may be used to adjust a level of a supply voltage, V_supply, provided by power converter 525, signals to cause adjustment of an operational mode, and so on. The frequency control signals may be used to adjust the frequency of the clock signal provided to functional circuit block 550, throttling of the clock signal, and so on. Additional details with regard to these functions will discussed below in further detail.

Voltage droop detection circuit 515 in the embodiment shown includes a comparator 501, an analog power supply 517, and a reference voltage generation circuit 518. Comparator 501 may be one of any of the various embodiments discussed above, and any variation thereof. Thus, comparator 501 may include at least one regenerative latch circuit, at least one corresponding output latch circuit, and a clock circuit configured to generate and provide a clock signal exclusive to circuitry within comparator 501. Reference voltage generator 518 is a voltage generation circuit (e.g., a bandgap circuit) configured to generate a reference voltage, Vref, that is used for a basis for comparison. Comparator 501 is also coupled to receive the supply voltage, V_Supply. Accordingly, comparator 501 is configured to compare the supply voltage, V_Supply, and the reference voltage, Vref, to detect the presence of a voltage droop. If comparator 501 determines that the supply voltage is less than the reference voltage, comparator 501 outputs a signal, Droop, indicative of the same. This signal is received in this embodiment by power management circuit 505, which may take corrective actions based on the detection of the droop.

Power converter 525 in the embodiment shown may be one of a number of different types of power converters. For example, power converter 525 may be a linear voltage regulator (e.g., an LDO, or low dropout regulator), a switching converter (e.g., buck converter or boost converter), and so on. In embodiments in which power converter 525, is a switching converter, multiple modes of operation (e.g., pulse frequency modulation, or PFM, pulse width modulation, or PWM) are possible and contemplated. Furthermore, some embodiment of a switching converter may be implemented as multi-phase converters, each phase being an individual instance of a particular power converter that may, when enabled, contribute to the overall voltage provided as V_Supply.

Clock frequency control circuit 525 in the embodiment shown may perform various functions for controlling a frequency of the F_Clk signal, and may also include clock generation circuitry for generating this clock signal. The circuitry for controlling the frequency of a clock signal may include clock dividers and/or clock multipliers, which may divide/multiply the frequency of an input clock signal. The clock generation circuitry, when included, may be any suitable type of circuit for generating a clock signal, including (but not limited to) a ring oscillator.

Functional circuit block 550 in the embodiment shown may be a circuit or group of circuits that carry out the various functions of system 500. The circuitry within functional circuit block 550 may include digital, analog, and/or mixed signal circuitry. Examples of the types of circuits that may be implemented in functional circuit block 550 include (but are not limited to) interface circuits, execution units of a processor, various other processor pipeline circuits, communications circuits, and so on.

As noted above, power management circuit 505 may carry out one or more corrective actions in response to receiving an indication from voltage droop detection circuit 515. A voltage droop may be defined herein as a decrease in the supply voltage below a limit that is considered to be sufficient for proper operation of functional circuit block 550. In this embodiment, the limit corresponds to the reference voltage. Accordingly, voltage droop detection circuit may generate an indication of a voltage droop in response to the value of V_supply falling below Vref. A voltage droop may be cause by various events, such as simultaneous switching of a large number of devices in functional circuit block 550. The corrective actions performed by power management circuit 505 may be designed to allow the supply voltage to increase back to a value that is above the acceptable lower limit indicated by the reference voltage, Vref.

One action that power management circuit 505 may perform in response to a voltage droop is to reduce the frequency of the clock signal, F_Clk, that is received by functional circuit block 550. Reducing the frequency may include any reduction in the clock frequency up to an including a complete stop of the clock signal. Reducing the frequency may decrease the amount of switching that takes place within a given time, which may allow time for the supply voltage to recover to an acceptable values.

Power management circuit 505 may also carry out corrective actions with regard to power converter 525 in an attempt to allow the supply voltage to recover to a value above Vref. For example, in embodiments in which power converter 525 is a switching power converter, power management circuit 505 may cause the switching converter to operate in a PWM mode that is more suitable for high current demand than a PFM mode. If the power converter is already in the PWM mode, power management circuit 505 may cause an increase in the pulse widths to increase the switching duty cycle corresponding to the amount of time the input voltage is provided to the converter. In embodiments in which power converter 525 is a multi-phase power converter, power management circuit 505 may cause the enabling of phases that were not enabled at the time of receiving the indication of a droop.

Various combinations of the actions described above may also be carried out by power management circuit 505 in order to allow recovery of the supply voltage to an acceptable level.

Figure 6:
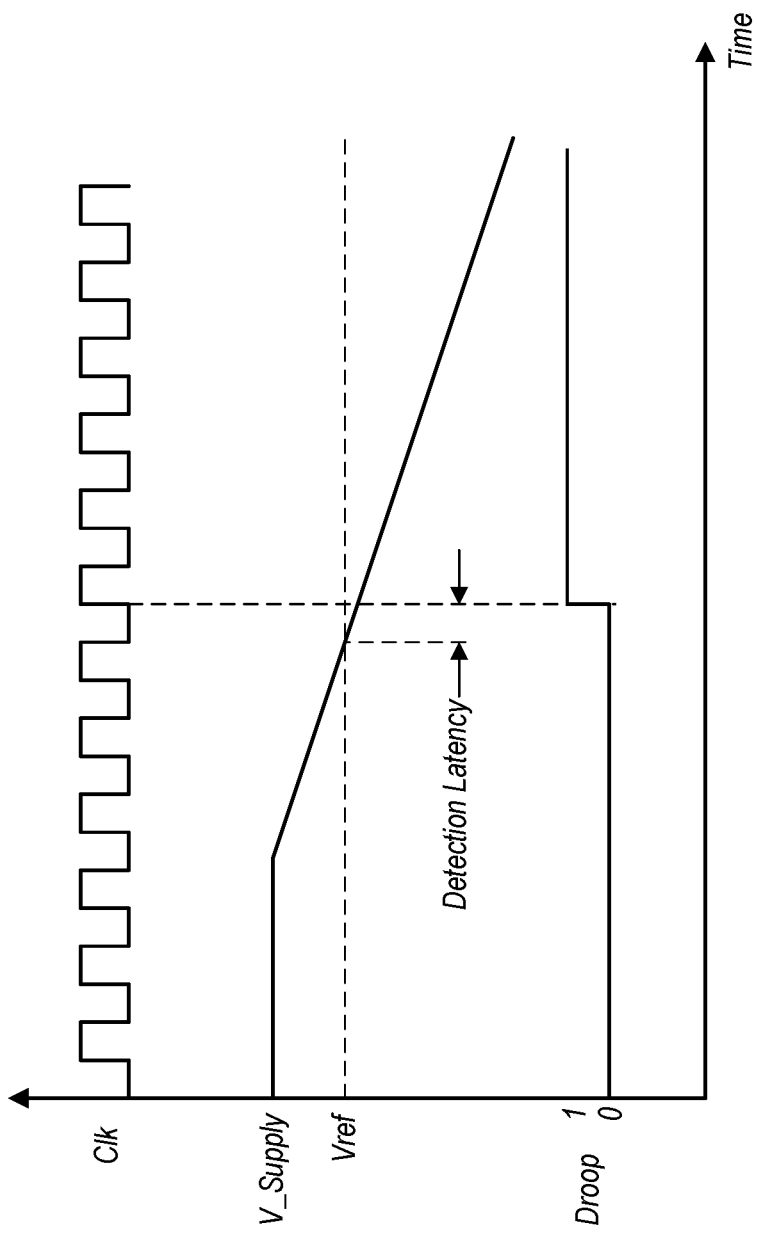
FIG. 6 is a graphic illustration of the operation of one embodiment of a comparator circuit.

FIG. 6 is a graphic illustration of the operation of one embodiment of comparator 501 when used in a voltage droop detection circuit. As shown here, the clock signal Clk is the local clock signal provided to the one or more regenerative amplifier circuits in the comparator. As shown in this example, the supply voltage, V_Supply, is above the reference voltage Vref at the beginning. The supply voltage then eventually falls to and then below the reference voltage in this example. At the time the supply voltage falls below the reference voltage, the clock signal is inactive. At the next rising edge of the clock signal, corresponding to the transition from the inactive phase to the active phase, the comparator detects the droop and the Droop signal is asserted as a logic 1. The detection latency is less than a full clock cycle, and may be less in multi-phase embodiments of the comparator circuit as disclosed herein.

Figure 7:
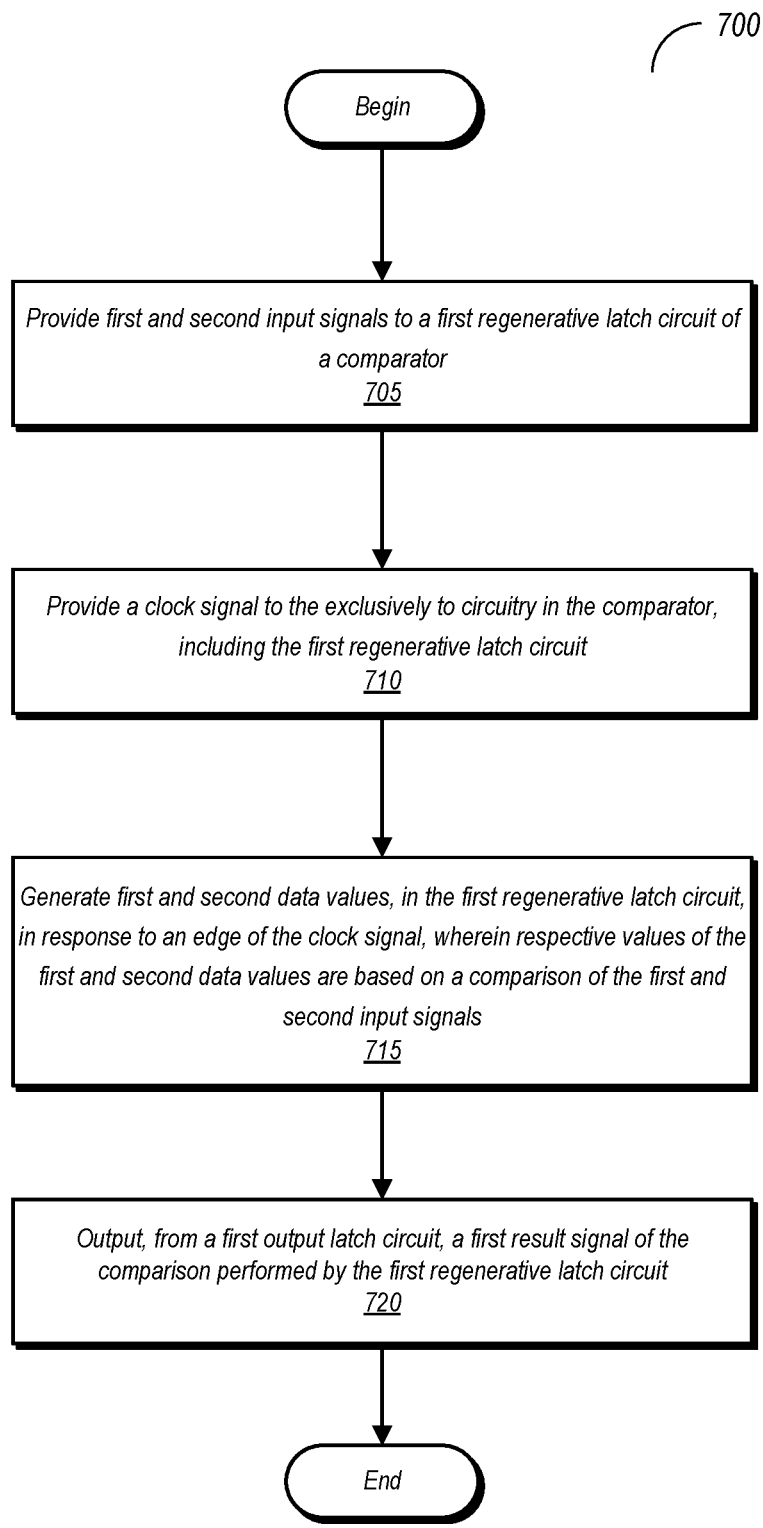
FIG. 7 is a flow diagram of one embodiment of a method for operating a comparator circuit.

Method of Operating a Comparator Circuit:

FIG. 7 is a flow diagram illustrating one embodiment of a method for operating a comparator circuit. Method 700 may apply to any of the embodiments of a comparator circuit as discussed above. Furthermore, embodiments of a comparator capable of carrying out Method 700, but not otherwise disclosed herein may be considered to fall within the scope of this disclosure.

Method 700 includes providing first and second input signals to a first regenerative latch circuit of a comparator (block 705). The method further includes providing a clock signal to the exclusively to circuitry in the comparator, including the first regenerative latch circuit (block 710). The method continues with the generation of first and second data values, in the first regenerative latch circuit, in response to an edge of the clock signal, wherein respective values of the first and second data values are based on a comparison of the first and second input signals. Using the first and second data values, the method includes outputting, from a first output latch circuit, a first result signal of the comparison performed by the first regenerative latch circuit (block 720).

In some embodiments, the comparator circuit is a multi-path comparator circuit. Accordingly, some embodiments of the method includes providing the first and second input signals to a plurality of regenerative latch circuits including the first regenerative latch circuit and providing the clock signal to ones of the plurality of regenerative latch circuits. Such method embodiments also include generating respective data signals in the ones of the plurality of regenerative latch circuits in response to the edge of the clock signal and outputting result signals, from ones of a plurality of output latch circuits based on respective data signals from corresponding ones of the plurality of regenerative latch circuit. A comparison result may be generated by ORing the results signals.

In various embodiments, the method includes generating the clock signal using a ring oscillator. These embodiments may also include the operating characteristics of the first regenerative latch circuit and the ring oscillator tracking one another over process, voltage, and temperature variations.

Various embodiments of the method further includes generating, during an active phase of the clock signal, the first and second data values on first and second internal data nodes, respectively, of the first regenerative latch circuit and precharging the first and second internal data nodes during an inactive phase of the clock signal.

In some embodiments, the comparator circuit may be utilized in a voltage droop detection circuit. Corresponding embodiments of the method may thus include providing a supply voltage as the first input signal to the first regenerative latch circuit and providing a reference voltage as the second input signal to the first regenerative latch circuit. Detecting a voltage droop in such an embodiment of the method may thus include providing an indication of a voltage droop to a power management circuit in response to the regenerative latch circuit receiving the supply voltage at a value that is less than a value of the reference voltage.

Figure 8:
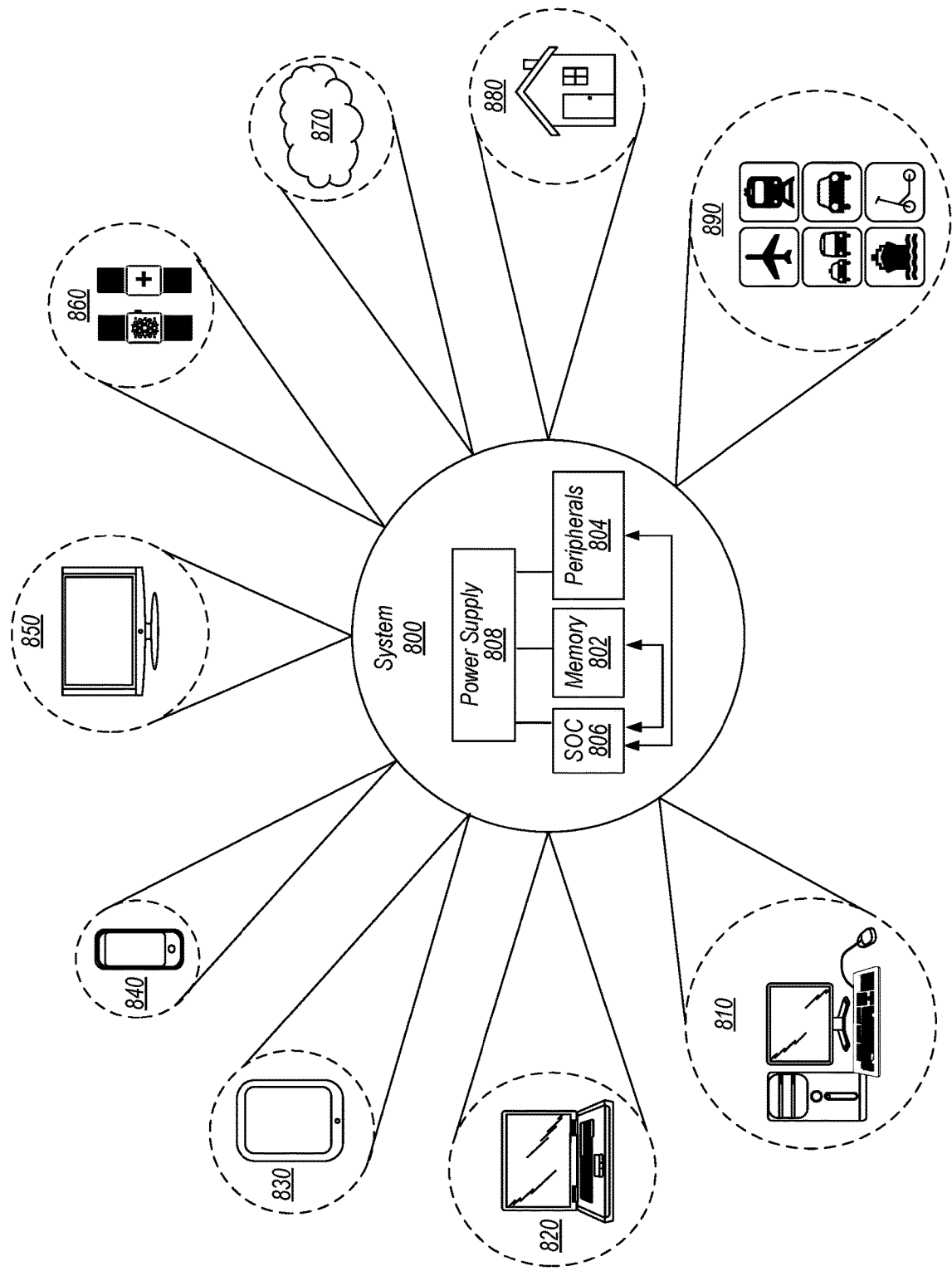
FIG. 8 is block diagram of one embodiment of an example system.

Example System:

Turning next to FIG. 8, a block diagram of one embodiment of a system 800 is shown that may incorporate and/or otherwise utilize the methods and mechanisms described herein. In the illustrated embodiment, the system 800 includes at least one instance of a system on chip (SoC) 806 which may include multiple types of processing units, such as a central processing unit (CPU), a graphics processing unit (GPU), or otherwise, a communication fabric, and interfaces to memories and input/output devices. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

In various embodiments of system 800, one or more instances of a comparator circuit as discussed above may be implemented. Instances may be implemented in any of the embodiments discussed herein. Furthermore, system 800 may also implement at least one instance of a droop detection circuit and various related components as discussed above.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C.

This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
 a comparator circuit configured to compare a first input signal to a second input signal, wherein the comparator circuit includes:
  a plurality of regenerative latch circuits, wherein ones of the plurality of regenerative latch circuits include respective first and second inputs configured to receive the first and second input signals, respectively;
  a clock circuit configured to generate and provide a plurality of clock signals exclusively to corresponding ones of the plurality of regenerative latch circuits, wherein ones of the plurality of regenerative latch circuits are configured to receive respective ones of the clock signals in different phases with respect to the clock signals received by other ones of the plurality of regenerative latch circuits;
  a plurality of output latch circuits coupled to corresponding ones of the regenerative latch circuits and configured to provide a respective output signal indicative of a comparison of the first and second input signals, wherein the comparator is configured to assert a comparison signal in response to a first one of the plurality of regenerative latch circuits to receive an inactive-to-active transition of the clock signal and, in response thereto, generate its respective output signal;
 a power converter configured to generate a supply voltage, wherein the first input signal to the comparator is the supply voltage and the second input signal to the comparator is a reference voltage; and
 a power management circuit configured to change one or more parameters of the power converter in response to the comparator circuit detecting a droop in the supply voltage.

2. The apparatus of claim 1, wherein ones of the plurality of regenerative latch circuits are configured to perform a precharge operation when its respectively received one of the plurality of clock signals is inactive, and further configured to generate respective first and second data signals, depending on respective states of the first and second input signals, when its respectively received one of the plurality of clock signals is active.

3. The apparatus of claim 1, wherein the clock circuit comprises a ring oscillator.

4. The apparatus of claim 1 further comprising an analog power supply configured to provide power to the comparator circuit.

5. The apparatus of claim 1, wherein the comparator circuit further includes:
 an OR gate coupled to receive respective output signals generated by the plurality of output latch circuits, wherein the OR gate is configured to generate a comparator output signal.

6. The apparatus of claim 1, wherein ones of the plurality of output latch circuits are set-reset (SR) latches.

7. The apparatus of claim 1, wherein the power management circuit configured to perform a corrective action based on receiving an indication of a voltage droop from the voltage droop detection circuit.

8. The apparatus of claim 7, wherein the power management circuit is configured to reduce a frequency of an operating clock signal provided to a functional circuit block in response to detecting the droop in the supply voltage.

9. The apparatus of claim 1, wherein the comparator circuit is configured to a generate a particular state of the comparison signal, in response to performing a comparison, with a latency of less than one full cycle of one of the plurality of clock signals.

10. A method comprising:
 providing first and second input signals to respective first and second inputs of ones of a plurality of regenerative latch circuits of a comparator, wherein the first input signal comprises a supply voltage generated by a power converter and the second input signal comprises a reference voltage;
 providing a plurality of clock signals exclusively to circuitry in the comparator, including the ones of the plurality of regenerative latch circuits, wherein providing the plurality of clock signals to ones of the plurality of regenerative latch circuits includes the ones of the plurality of regenerative latch circuits receiving a respective one of the plurality of clock signals in different phases with respect to other ones of the plurality of regenerative latch circuits;
 generating respective first and second data values, in ones of the plurality of regenerative latch circuits, in response to an edge of a respective one of the plurality of clock signals, wherein respective values of the first and second data values are based on comparisons of the supply voltage and the reference voltage in ones of the plurality of regenerative latch circuits;
 receiving results of the comparisons from ones of the plurality of regenerative latch circuits in corresponding ones of a plurality of output latch circuits; and
 outputting, from the comparator, a comparison signal of the comparisons performed by the ones of the plurality of regenerative latch circuits, wherein generating the comparison result signal comprises asserting a first output signal in response to a first one of the plurality of regenerative latch circuits receiving an inactive-to-active transition of its respective one of the plurality of clock signals, wherein the comparison result signal is indicative of detection, by the comparator, of a droop in the supply voltage; and
 changing, by a power management circuit, one or more parameters of the power converter in response to the comparator detecting the droop in the supply voltage.

11. The method of claim 10, further comprising:
 outputting result signals, from ones of a plurality of output latch circuits based on respective data signals from corresponding ones of the plurality of regenerative latch circuits; and
 providing the comparison signal by ORing the results signals.

12. The method of claim 10, further comprising:
generating the plurality of clock signals using a ring oscillator.

13. The method of claim 10, further comprising:
generating, when the respective one of the plurality of clock signals is active, respective instances of the first and second data values on respective first and second internal data nodes of ones of the plurality of regenerative latch circuits; and
precharging the respective first and second internal data nodes of ones of the plurality of regenerative latch circuits during an inactive phase of the respective ones of the plurality clock signals.

14. The method of claim 10, wherein changing one or more parameters comprises the power management circuit causing a reduction of a frequency of an operating clock signal provided to a functional circuit block that is coupled to receive the supply voltage.

15. A system comprising:
a power management circuit;
a power converter coupled to the power management circuit and configured to provide a supply voltage to a functional circuit block;
a voltage droop detection circuit configured to detect a droop in a supply voltage, wherein the voltage droop detection circuit includes a comparator configured to generate an indication of a voltage droop, the comparator comprising:
a plurality of regenerative latch circuits having respective first and second inputs configured to receive the supply voltage and a reference voltage, respectively and configured to generate respective instances of first and second data signals based on respective levels of the supply voltage and the reference voltage;
a clock circuit configured to generate and provide a plurality of clock signals including a first clock signal exclusively to ones of the plurality of regenerative latch circuits, wherein ones of the plurality of regenerative latch circuits are configured to receive the first clock signal in different phases with respect to other ones of the plurality of regenerative latch circuits; and
a plurality of output latch circuits coupled to corresponding ones of the regenerative latch circuits and configured to provide respective output signals indicative of a comparison of the supply voltage and the reference voltage, wherein the comparator is configured to assert the comparison signal in response to a first one of the plurality of regenerative latch circuits to receive an inactive-to-active transition of the first clock signal and, in response thereto, generate its respective output signal;
wherein the power management circuit is configured to perform one or more corrective actions in response to receiving the indication of the voltage droop; and
wherein, in response to the voltage droop detection circuit detecting the droop in a supply voltage, the power management circuit is configured to change one or more operating parameters of the power converter.

16. The system of claim 15, wherein the comparator further includes:
an OR gate configured to perform an OR function on the respective output signals to generate the indication.

17. The system of claim 15, wherein the ones of the plurality of regenerative latch circuit are configured to:
generate respective instances of the first and second data signals on respective first and second data nodes, respectively, in response to an inactive-to-active transition of a respectively received one of the plurality of clock signals; and
precharge the first and second data nodes when the respectively received one of the plurality of clock signals is inactive.

18. The system of claim 15, wherein the power management circuit is configured to reduce a frequency of a second clock signal to a functional circuit block configured to operate using the supply voltage.

19. The system of claim 15, wherein the voltage droop detection circuit is configured to detect the voltage droop with a latency of less than one full cycle of the clock signal after occurrence of the voltage droop.

20. The system of claim 15, wherein the power management circuit is configured to generate one or more power control signal in response to the voltage droop detection circuit detecting the voltage droop.

* * * * *